United States Patent [19]

Saller et al.

[11] Patent Number: 4,639,685

[45] Date of Patent: Jan. 27, 1987

[54] OFFSET REDUCTION IN UNITY GAIN BUFFER AMPLIFIERS

[75] Inventors: Kenneth R. Saller, Ft. Collins; Kurt R. Rentel, Loveland, both of Colo.

[73] Assignee: Comlinear Corporation, Fort Collins, Colo.

[21] Appl. No.: 756,750

[22] Filed: Jul. 18, 1985

[51] Int. Cl.⁴ ............................ H03F 3/26; H03F 3/45
[52] U.S. Cl. ..................................... 330/263; 330/267; 330/255

[58] Field of Search ............... 330/252, 255, 257, 149, 330/263, 267

[56] References Cited

U.S. PATENT DOCUMENTS 4,540,951 9/1985 Ozawa et al. ...................... 330/267

Primary Examiner—Gene Wan

[57] ABSTRACT

Unity gain buffer amplifier circuits having a reduced input-to-output offset voltage characteristic are described. Compensation for the effects of base-to-emitter voltage variations and early voltage is employed.

4 Claims, 4 Drawing Figures

4,639,685

OFFSET REDUCTION IN UNITY GAIN BUFFER AMPLIFIERS

REFERENCE TO RELATED PATENT

This application is related to the subject matter of U.S. Pat. Ser. No. 4,502,020 entitled Settling Time Reduction in Wide-Band Direct-Coupled Transistor Amplifiers, issued on Feb. 16, 1985, to David A. Nelson and Kenneth R. Saller. The subject matter thereof is incorporated herein by reference.

BACKGROUND AND SUMMARY OF THE INVENTION

This invention relates to various circuit arrangements for reducing the input-to-output offset voltage (hereinafter referred to as offset) and the offset drift (hereinafter referred to as drift) as a function of temperature inherent in a commonly employed unity gain buffer amplifier illustrated in FIG. 1. This prior art circuit has been described by Knitter and Zuch, *Unity-Gain Buffer Amplifier is Ultrafast*, Electronics, Apr. 27, 1978, pp. 124–126. The offset and drift of this circuit is dependent upon the difference of the base-to-emitter voltage drops in the NPN and PNP transistors employed therein. Given arbitrary NPN and PNP transistor types, this difference may be large.

DESCRIPTON OF THE DRAWINGS

DETAILED DESCRIPTION OF THE ILLUSTRATED EMBODIMENTS OF THE INVENTION

In the description below referencing FIGS. 1–4, the following notation conventions have been used: $Vbexy$ is the base-emitter voltage (Vbe) of the transistor labelled $Qxy$ under discussion; $Icxy$ is the collector current (Ic) of the transistor labelled $Qxy$ under discussion; and $Isxy$ is the reverse saturation current (Is) of the transistor labelled $Oxy$ under discussion.

Figure 1:
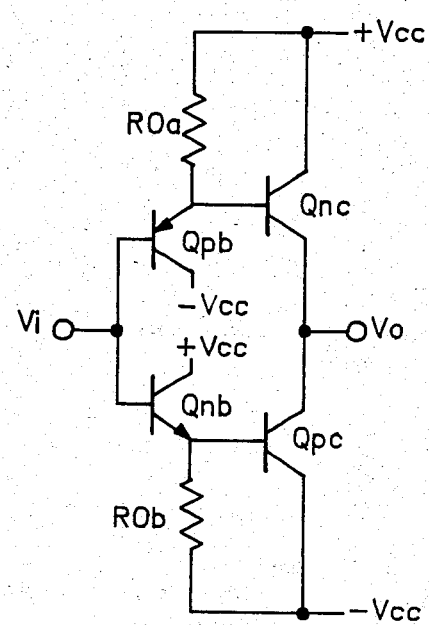
FIG. 1 is a detailed schematic diagram of a unity gain buffer amplifier circuit known in the prior art.

Referring now to FIG. 1, there is shown a unity gain buffer amplifier circuit constructed in accordance with the prior art. Assuming that the NPN transistors Qnb and Qnc are matched and that the PNP transistors Qpb and QPc are similarly matched, and further assuming B (beta) and VA (Early voltage) are equal in all of the transistors, the offset $(Vi-Vo)=0$ when $Icpb=Icnb(Ispb/Isnc)^2$. Therefore, in order to null the offset to zero requires a large mismatch in collector currents in the input stage, which results in increased bias current and also adversely affects other performance factors.

Figure 2:
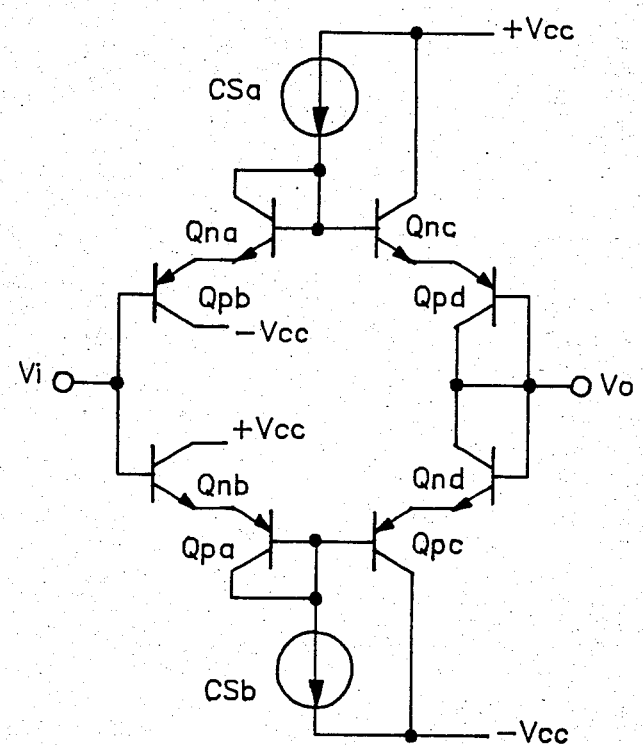
FIG. 2 is a detailed schematic diagram of a unity gain buffer amplifier constructed in accordance with the preferred embodiment of the present invention.

Referring now to the circuit diagram of FIG. 2, there is shown a unity gain buffer amplifier constructed to reduce the offset and drift characteristics. In this circuit, the offset $(Vi-Vo)=-(Vbepb+Vbena-Vbenc--Vbepd)=Vbenb+Vbepa-Vbepc-Vbend$. Then, since (for a single transistor) $Vbe=(Vt)\ln(Ic/Is)$, the offset is equal to $(Vt)\ln(IcpbIcnaIsncIspd/IspbIsnaIcn-cIcpd)^{-1}$, which is equal to $(Vt)\ln(IcnbIcpaIspcIsnd/IsnbIspaIcpcIcnd)$.

Assume that B and VA for all transistors illustrated are equal. It is a simple matter to purchase NPN transistors with closely matched reverse saturation current (Is) characteristics and also PNP transistors with closely matched reverse saturation current characteristics. Then, if $CSa=CSb$, by slightly varying the ratio $CSa/CSb$ as necessary, a zero offset can be achieved independent of the small transistor Vbe mismatches. The drift is equal to the offset divided by T, where T is the temperature of the transistors in degrees Kelvin.

In practice, VA, which describes the effect of base width modulation on Vbe, will not usually be the same for NPN and PNP transistors. With finite values of VA, a smaller Vbe voltage will cause the same collector current Ic to exist. Therefore, to compensate for differing finite values of VA in NPN and PNP transistors, slight differences in the ratio $CSa/CSb$ can be used to correct for nonzero offset and drift values caused by VA and Vbe mismatches. Similarly, this technique can be used to reduce offset caused by B mismatches, although drift may not necessarily be reduced in proportion to offset.

Figure 3:
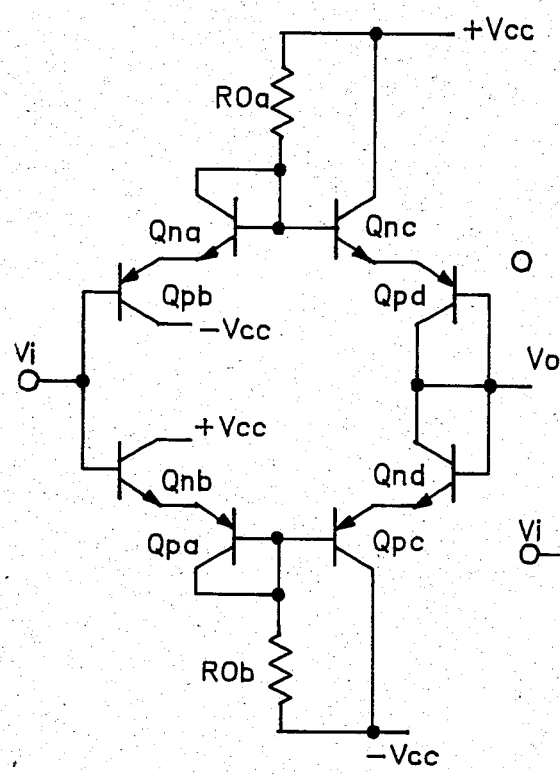
FIG. 3 is a detailed schematic diagram of a unity gain buffer amplifier constructed in accordance with an alternate embodiment of the present invention.
Figure 4:
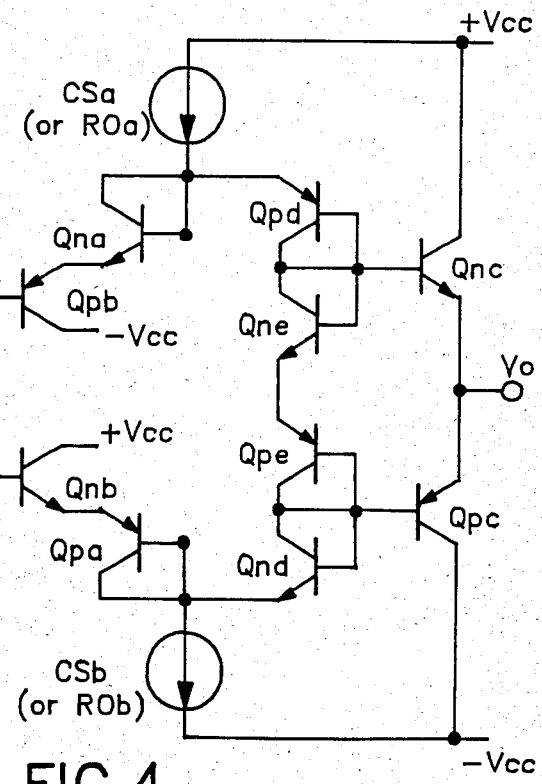
FIG. 4 is a detailed schematic diagram of a unity gain buffer amplifier constructed in accordance with another alternate embodiment of the present invention.

Referring now to FIG. 3, the resistors ROa and ROb cause the ratio $Icna/Icpa$ to vary depending on Vi, thus causing the offset and drift to vary. However, in applications where $Vi<<Vcc$, those variations may not be a problem in view of the reduced circuit complexity.

In order to achieve increased stability in the frequency response of Vo/Vi for the circuits of FIGS. 2 and 3, resistors in series with the bases or emitters in any combination may be useful. The offset and drift characteristics will be changed slightly but a reduction in both may still be achieved.

The collectors of transistors Qnc and Qpc are shown connected to $+Vcc$ and $-Vcc$, respectively, for use as a buffer circuit. The collectors could also be connected to other circuitry rather than the supply voltage Vcc. An example of this is the use of the circuit of FIG. 2 or 3 as a replacement for the input stage consisting of transistors Q0, Q1, and RF2 in FIG. 2 of referenced U.S. Pat. No. 4,502,020 to offer reduced input offset voltages.

We claim:

1. A unity gain buffer amplifier, the amplifier comprising:
    first PNP transistor means having base, emitter, and collector electrodes, the collector electrode of which is connected to a source of negative supply voltage;
    first NPN transistor means having base, emitter, and collector electrodes, the collector electrode of which is connected to a source of positive supply voltage, and the base electrode of which is connected to the base electrode of said first PNP transistor means and for receiving an input signal;
    second PNP transistor means having base, emitter, and collector electrodes, the emitter electrode of which is connected to the emitter electrode of said first NPN transistor means and the base and collector electrodes of which are connected together and, through a first current source, to said source of negative supply voltage;
    second NPN transistor means having base, emitter, and collector electrodes, the emitter electrode of which is connected to the emitter electrode of said first PNP transistor means and the base and collector electrodes of which are connected together and, through a second current source, to said source of positive supply voltage;

third PNP transistor means having base, emitter, and collector electrodes, the base electrode of which is connected to the base electrode of said second PNP transistor means and the collector electrode of which is connected to said source of negative supply voltage;

third NPN transistor means having base, emitter, and collector electrodes, the base electrode of which is connected to the base electrode of said second NPN transistor means and the collector electrode of which is connected to said source of positive supply voltage;

fourth PNP transistor means having base, emitter, and collector electrodes, the emitter electrode of which is connected to the emitter electrode of said third NPN transistor means and the base and collector electrodes of which are connected together; and fourth NPN transistor means having base, emitter, and collector electrodes, the emitter electrode of which is connected to the emitter electrode of said third PNP transistor means and the base and collector electrodes of which are connected together and to the base and collector electrodes of said fourth PNP transistor means to provide an output of said unity gain buffer amplifier.

2. A unity gain buffer amplifier, the amplifier comprising:

first PNP transistor means having base, emitter, and collector electrodes, the collector electrode of which is connected to a source of negative supply voltage;

first NPN transistor means having base, emitter, and collector electrodes, the collector electrode of which is connected to a source of positive supply voltage, and the base electrode of which is connected to the base electrode of said first PNP transistor means and for receiving an input signal;

second PNP transistor means having base, emitter, and collector electrodes, the emitter electrode of which is connected to the emitter electrode of said first NPN transistor means and the base and collector electrodes of which are connected together and, through a first resistor, to said source of negative supply voltage;

second NPN transistor means having base, emitter, and collector electrodes, the emitter electrode of which is connected to the emitter electrode of said first PNP transistor means and the base and collector electrodes of which are connected together and, through a second resistor, to said source of positive supply voltage;

third PNP transistor means having base, emitter, and collector electrodes, the base electrode of which is connected to the base electrode of said second PNP transistor means and the collector electrode of which is connected to said source of negative supply voltage;

third NPN transistor means having base, emitter, and collector electrodes, the base electrode of which is connected to the base electrode of said second NPN transistor means and the collector electrode of which is connected to said source of positive supply voltage;

fourth PNP transistor means having base, emitter, and collector electrodes, the emitter electrode of which is connected to the emitter electrode of said third NPN transistor means and the base and collector electrodes of which are connected together; and fourth NPN transistor means having base, emitter, and collector electrodes, the emitter electrode of which is connected to the emitter electrode of said third PNP transistor means and the base and collector electrodes of which are connected together and to the base and collector electrodes of said fourth PNP transistor means to provide an output of said unity gain buffer amplifier.

3. A unity gain buffer amplifier, the amplifier comprising:

first PNP transistor means having base, emitter, and collector electrodes, the collector electrode of which is connected to a source of negative supply voltage;

first NPN transistor means having base, emitter, and collector electrodes, the collector electrode of which is connected to a source of positive supply voltage, and the base electrode of which is connected to the base electrode of said first PNP transistor means and for receiving an input signal;

second PNP transistor means having base, emitter, and collector electrodes, the emitter electrode of which is connected to the emitter electrode of said first NPN transistor means and the base and collector electrodes of which are connected together and, through a first current source, to said source of negative supply voltage;

second NPN transistor means having base, emitter, and collector electrodes, the emitter electrode of which is connected to the emitter electrode of said first PNP transistor means and the base and collector electrodes of which are connected together and, through a second current source, to said source of positive supply voltage;

third PNP transistor means having base, emitter, and collector electrodes, the emitter electrode of which is connected to the base and collector electrodes of said second NPN transistor means and the base and collector electrodes of which are connected together;

third NPN transistor means having base, emitter, and collector electrodes, the base and collector electrodes of which are connected together and to the base and collector electrodes of said third PNP transistor means;

fourth PNP transistor means having base, emitter, and collector electrodes, the emitter electrode of which is connected to the emitter electrode of said third NPN transistor means and the base and collector electrodes of which are connected together; and fourth NPN transistor means having base, emitter, and collector electrodes, the emitter electrode of which is connected to the base and collector electrodes of said second PNP transistor means and the base and collector electrodes of which are connected together and to the base and collector electrodes of said fourth PNP transistor means;

fifth PNP transistor means having base, emitter, and collector electrodes, the base electrode of which is connected to the base and collector electrodes of said fourth PNP and said fourth NPN transistor means and the collector electrode of which is connected to said source of negative supply voltage; and fifth NPN transistor means having base, emitter, and collector electrodes, the base electrode of which is connected to the base and collector electrodes of said third NPN transistor means and said third PNP transistor means, the collector electrode of which is connected to said source of positive supply voltage, and the emitter electrode of which is connected to the emitter electrode of said fifth PNP transistor means to provide an output of said unity gain buffer amplifier.

4. A unity gain buffer amplifier, the amplifier comprising:

first PNP transistor means having base, emitter, and collector electrodes, the collector electrode of which is connected to a source of negative supply voltage;

first NPN transistor means having base, emitter, and collector electrodes, the collector electrode of which is connected to a source of positive supply voltage, and the base electrode of which is connected to the base electrode of said first PNP transistor means and for receiving an input signal;

second PNP transistor means having base, emitter, and collector electrodes, the emitter electrode of which is connected to the emitter electrode of said first NPN transistor means and the base and collector electrodes of which are connected together and, through a first resistor, to said source of negative supply voltage;

second NPN transistor means having base, emitter, and collector electrodes, the emitter electrode of which is connected to the emitter electrode of said first PNP transistor means and the base and collector electrodes of which are connected together and, through a second resistor, to said source of positive supply voltage;

third PNP transistor means having base, emitter, and collector electrodes, the emitter electrode of which is connected to the base and collector electrodes of said second NPN transistor means and the base and collector electrodes of which are connected together;

third NPN transistor means having base, emitter, and collector electrodes, the base and collector electrodes of which are connected together and to the base and collector electrodes of said third PNP transistor means;

fourth PNP transistor means having base, emitter, and collector electrodes, the emitter electrode of which is connected to the emitter electrode of said third NPN transistor means and the base and collector electrodes of which are connected together; and fourth NPN transistor means having base, emitter, and collector electrodes, the emitter electrode of which is connected to the base and collector electrodes of said second PNP transistor means and the base and collector electrodes of which are connected together and to the base and collector electrodes of said fourth PNP transistor means;

fifth PNP transistor means having base, emitter, and collector electrodes, the base electrode of which is connected to the base and collector electrodes of said fourth PNP and said fourth NPN transistor means and the collector electrode of which is connected to said source of negative supply voltage; and fifth NPN transistor means having base, emitter, and collector electrodes, the base electrode of which is connected to the base and collector electrodes of said third NPN transistor means and said third PNP transistor means, the collector electrode of which is connected to said source of positive supply voltage, and the emitter electrode of which is connected to the emitter electrode of said fifth PNP transistor means to provide an output of said unity gain buffer amplifier.

* * * * *